US011836029B2

(12) United States Patent
Song et al.

(10) Patent No.: US 11,836,029 B2
(45) Date of Patent: *Dec. 5, 2023

(54) SYSTEM ON CHIP CONTROLLING MEMORY POWER USING HANDSHAKE PROCESS AND OPERATING METHOD THEREOF

(71) Applicant: SAMSUNG ELECTRONICS CO., LTD., Suwon-si (KR)

(72) Inventors: Jin-Ook Song, Seoul (KR); Yun-Ju Kwon, Yongin-si (KR); Dong-Sik Cho, Yongin-si (KR); Byung-Tak Lee, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/827,847

(22) Filed: May 30, 2022

(65) Prior Publication Data
US 2022/0291737 A1    Sep. 15, 2022

Related U.S. Application Data

(63) Continuation of application No. 16/670,026, filed on Oct. 31, 2019, now Pat. No. 11,347,292, which is a (Continued)

(30) Foreign Application Priority Data

Jan. 19, 2017  (KR) .................. 10-2017-0009371

(51) Int. Cl.
G06F 1/32      (2019.01)
G11C 5/14      (2006.01)
(Continued)

(52) U.S. Cl.
CPC .......... G06F 1/3225 (2013.01); G06F 1/3275 (2013.01); G06F 1/3287 (2013.01);
(Continued)

(58) Field of Classification Search
CPC .... G06F 1/3225; G06F 1/3275; G06F 1/3287; G06F 1/3296; G11C 5/14
See application file for complete search history.

(56) References Cited

U.S. PATENT DOCUMENTS 6,711,691 B1    3/2004  Howard et al.
7,039,755 B1    5/2006  Helms
(Continued)

FOREIGN PATENT DOCUMENTS

CN    1591368 A       3/2005
CN    101103344 A     1/2008
(Continued)

OTHER PUBLICATIONS

Chinese Office Action dated Dec. 21, 2022 Cited in CN Patent Application No. 201710972454.9.

Primary Examiner — Stefan Stoynov
(74) Attorney, Agent, or Firm — Fish & Richardson P.C.

(57) ABSTRACT

A system on chip (SoC) adjusts power of a memory through a handshake. The SoC includes a memory controller and a power manager. The memory controller is configured to control a memory. The power manager is configured to manage a supply power level of the memory. The memory controller is configured to output, to the power manager, a memory access level indicating a frequency of accesses to the memory. The power manager is configured to adjust the supply power level of the memory according to the memory access level.

20 Claims, 16 Drawing Sheets

Related U.S. Application Data continuation of application No. 15/677,050, filed on Aug. 15, 2017, now Pat. No. 10,481,668.

(51) Int. Cl.
*G06F 1/3225* (2019.01)
*G06F 15/78* (2006.01)
*G06F 1/3296* (2019.01)
*G06F 1/3287* (2019.01)
*G06F 1/3234* (2019.01)

(52) U.S. Cl.
CPC ........ *G06F 1/3296* (2013.01); *G06F 15/7821* (2013.01); *G11C 5/14* (2013.01)

(56) References Cited

U.S. PATENT DOCUMENTS

| | | | |
|---|---|---|---|
| 7,395,398 B2 | 7/2008 | Kim | |
| 7,650,481 B2 | 1/2010 | Walker | |
| 8,448,001 B1 | 5/2013 | Zhu et al. | |
| 8,645,743 B2 | 2/2014 | Machnicki et al. | |
| 8,826,047 B1 | 9/2014 | Zhu et al. | |
| 8,837,217 B2 | 9/2014 | Chu | |
| 8,862,920 B2 | 10/2014 | Branover et al. | |
| 9,189,053 B2 | 11/2015 | Cui et al. | |
| 9,286,985 B2 | 3/2016 | Kimura | |
| 9,310,783 B2 | 4/2016 | Machnicki et al. | |
| 9,377,830 B2 | 6/2016 | Yang | |
| 9,395,777 B2 | 7/2016 | Kim et al. | |
| 9,405,671 B2 | 8/2016 | Tanaka et al. | |
| 9,477,289 B2 | 10/2016 | Jain et al. | |
| 9,477,419 B2 | 10/2016 | Gemmeke et al. | |
| 9,740,267 B1 | 8/2017 | Cordero | |
| 2009/0292934 A1 | 11/2009 | Esliger | |
| 2013/0262894 A1 | 10/2013 | Lee et al. | |
| 2015/0378424 A1 | 12/2015 | Anyuru | |
| 2016/0116971 A1 | 4/2016 | Luan et al. | |
| 2016/0216751 A1 | 7/2016 | Kim et al. | |

FOREIGN PATENT DOCUMENTS

| | | |
|---|---|---|
| CN | 103365800 A | 10/2013 |
| TW | 201629760 A | 8/2016 | her# SYSTEM ON CHIP CONTROLLING MEMORY POWER USING HANDSHAKE PROCESS AND OPERATING METHOD THEREOF

CROSS-REFERENCE TO RELATED APPLICATION

This is a Continuation of U.S. application Ser. No. 16/670,026, filed Oct. 31, 2019, now U.S. Pat. No. 11,347,292, issued May 31, 2022, which is a Continuation of U.S. application Ser. No. 15/677,050, filed Aug. 15, 2017, now U.S. Pat. No. 10,481,668, issued Nov. 19, 2019, and a claim of priority under 35 U.S.C. 119 is made to Korean Patent Application No. 10-2017-0009371, filed on Jan. 19, 2017, in the Korean Intellectual Property Office, the disclosures of which are incorporated herein in their entireties by reference.

BACKGROUND

1. Field of the Disclosure

The present disclosure relates to a system on chip (SoC) and a method of operating the same. More particularly, the present disclosure relates to an SoC that controls power of a memory through a handshake.

2. Description of the Related Art

An SoC is a semiconductor technology by which an existing complex system having various functions is embodied as a single chip. The SoC may include a device with a unique circuit arrangement (e.g., a specific circuit arrangement protected by intellectual property rights), and a memory. The device with the unique circuit arrangement may be a device that functions as a master that accesses the memory to process data, etc.

Also, the SoC may include a power manager that manages power of the memory, or the like. In the SoC, the power manager may provide a uniform level of supply power to the memory, such that it is necessary to efficiently manage power so that operation performance of the memory does not degrade.

SUMMARY

The present disclosure provides a SoC including a power manager capable of reducing power consumed by a memory by optimizing power consumption thereof.

The present disclosure provides a method of operating a power manager capable of reducing power consumed by a memory by optimizing power consumption thereof.

According to an aspect of the present disclosure, an SoC includes a memory controller and a power manager. The memory controller is configured to control a memory. The power manager is configured to manage a supply power level of the memory. The memory controller is configured to output, to the power manager, a memory access level indicating a frequency of accesses to the memory. The power manager is configured to adjust the supply power level of the memory according to the memory access level.

According to another aspect of the present disclosure, a method of operating a power manager included in an SoC includes receiving a memory access level indicating a frequency of accesses to a memory from a memory controller. The method also includes determining whether the memory access level is equal to or higher than an access level threshold. The method further includes outputting a control signal for setting a supply power level of the memory.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
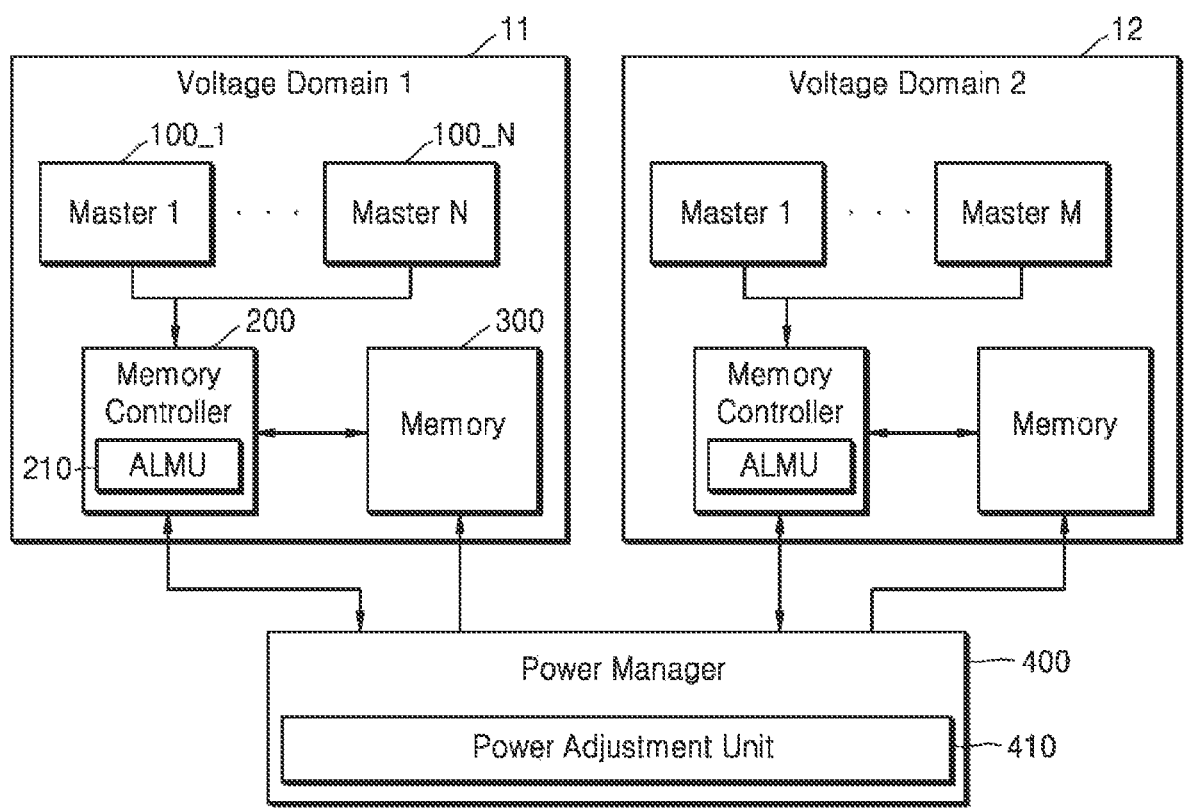
FIG. 1 illustrates a block diagram of a SoC, according to an embodiment.

FIG. 1 illustrates a block diagram of a SoC 10 according to an embodiment.

As described herein, a SoC 10 may be a single, integrated circuit provided as a single chip such that all components are physically connected directly or indirectly to one another on a single substrate. The SoC 10 may be a device that is installed as a component in another device. The SoC 10 may include communications capabilities such as for digital and/or analog signals. The SoC 10 may include all components of, for example, an electronic system or sub-system.

Referring to FIG. 1, the SoC 10 may include a first voltage domain 11, a second voltage domain 12, and a power manager 400. The first voltage domain 11 may include first to $N^{th}$ masters 100_1 to 100_N, a memory controller 200, and a memory 300. The second voltage domain 12 may also include first to $M^{th}$ masters (unnumbered), an additional memory controller (unnumbered), and an additional memory (unnumbered). Different power voltages may be applied to the first voltage domain 11 and the second voltage domain 12. For example, a first power voltage may be applied to the first voltage domain 11, and a second power voltage may be applied to the second voltage domain 12. FIG. 1 illustrates two voltage domains, i.e., the first voltage domain 11 and the second voltage domain 12, but the voltage domains are not limited thereto. The SoC may include only one voltage domain, or more than two voltage domains.

FIG. 1 illustrates that the first voltage domain 11 includes the first to $N^{th}$ masters 100_1 to 100_N, the memory controller 200, and the memory 300, and the second voltage domain 12 includes the additional first to $M^{th}$ masters (unnumbered), the additional memory controller (unnumbered), and the additional memory (unnumbered). However, at least some of the first to $N^{th}$ masters 100_1 to 100_N, the memory controller 200, and the memory 300 may be shared among the voltage domains, i.e., the first voltage domain 11 and the second voltage domain 12. That is, the first voltage domain 11 and the second voltage domain 12 may share the same $N^{th}$ masters 100_1 to 100_N, the same memory controller 200, and/or the memory 300 in common. Similarly, the first voltage domain 11 and the second voltage domain 12 may also, or alternatively, share the additional first to $M^{th}$ masters (unnumbered), the additional memory controller (unnumbered), and the additional memory (unnumbered). Hereinafter, only the first voltage domain 11 and the elements therein will be described, but the descriptions thereof may be applied to the second voltage domain 12 and the additional unnumbered elements shown therein in FIG. 1.

The first to $N^{th}$ masters 100_1 to 100_N may indicate (e.g., correspond to) all intelligent devices that may access the memory 300 through the memory controller 200. The first to $N^{th}$ masters 100_1 to 100_N may access the memory 300. To this end, the first to $N^{th}$ masters 100_1 to 100_N may be connected to the memory controller 200 for communication therebetween. For example, the first to $N^{th}$ masters 100_1 to 100_N may read data from the memory 300 by outputting an address to the memory controller 200 or may write data to the memory 300 by outputting the data to the memory controller 200.

The memory controller 200 may output various signals for controlling the memory 300. The memory controller 200 may read data from the memory 300 by outputting an address thereto or may write data to the memory 300 by outputting the data thereto.

The memory controller 200 may include an access level managing unit (ALMU) 210. The ALMU 210 may generate information regarding a frequency of accesses (i.e., number of accesses over a specified time) of the first to $N^{th}$ masters 100_1 to 100_N to the memory 300. Hereinafter, in the present specification, a memory access level may indicate a frequency of accesses of the first to $N^{th}$ masters 100_1 to 100_N to the memory 300. For example, the ALMU 210 may identify and provide, as the memory access level, a count of each read request and each write request made by the first to $N^{th}$ masters 100_1 to 100_N to the memory 300 during a unit time. According to an embodiment, the ALMU 210 may output the generated memory access level to the power manager 400. The frequency of accesses may correspond to the number of accesses over a specified fixed unit time, such as over a second, minute, hour, day, or year. Alternatively, the frequency of accesses may correspond to the number of accesses between particular events, such as an event that starts a clock and the current time.

The memory 300 may be a semiconductor device that may write or read data and may be a memory that may quickly write or read data. The memory 300 may be a volatile memory such as a Static Random Access Memory (SRAM), a Dynamic RAM (DRAM), a latch, a Flip-Flop, or a register. However, the memory 300 is not limited thereto, and the memory 300 may be a non-volatile memory such as a NAND Flash Memory, a Vertical NAND (VNAND), a NOR Flash Memory, a Resistive RAM (RRAM), a Phase Change RAM (PRAM), a Magnetoresistive RAM (MRAM), a Ferroelectric RAM (FRAM), or a Spin-Transfer Torque RAM (STT-RAM). The memory 300 may perform a write operation by receiving data and an address from the memory controller 200 or may perform a read operation by receiving an address.

The power manager 400 may manage power supplied to the memory 300. The power manager 400 may be embodied as a power management unit (PMU) on the SoC 10. A power management unit may be or include a microcontroller, and may include firmware, software stored in a dedicated memory, and a processor that executes the software to perform processes of a power manager 400 as described herein. The power manager 400 may include a power adjustment unit 410, defined as a combination of power adjustment software stored in the dedicated memory and the processor that executes the power adjustment software. The power adjustment unit 410 may adjust a supply power level of power supplied to the memory 300. The supply power level is changed from a current supply power level to a new supply power level.

According to an embodiment, the power manager 400 may receive the memory access level from the memory controller 200 and may determine the supply power level of the memory 300. Also, the power manager 400 may output, to the memory controller 200, a result of determining the supply power level of the memory 300. A "handshake" as described herein, may generally refer to processes whereby (1) the memory controller 200 outputs the memory access level to the power manager 400, the power manager 400 (2) determines the supply power level of the memory 300 based on the memory access level, and the (3) the power manager 400 outputs a determination result to the memory controller 200. According to the present disclosure, since the memory controller 200 and the power manager 400 may identify the memory access level and the supply power level of the memory 300 and thus may adjust the supply power level accordingly, power of the memory 300 may be effectively managed. The supply power level is changed from the current supply power level to the new supply power level based on the memory access level, and thus based on the frequency of access to the memory 300.

According to an embodiment, the memory controller 200 of the first voltage domain 11, the memory controller of the second voltage domain 12, and the power manager 400 may each adjust the supply power level of the power supplied to the memory 300 through a handshake. Since reference voltages of the first voltage domain 11 and the second voltage domain 12 are different from each other, different levels of power may be applied to the memory 300 even though the first voltage domain 11 and the second voltage domain 12 have the same memory access level.

Figure 2:
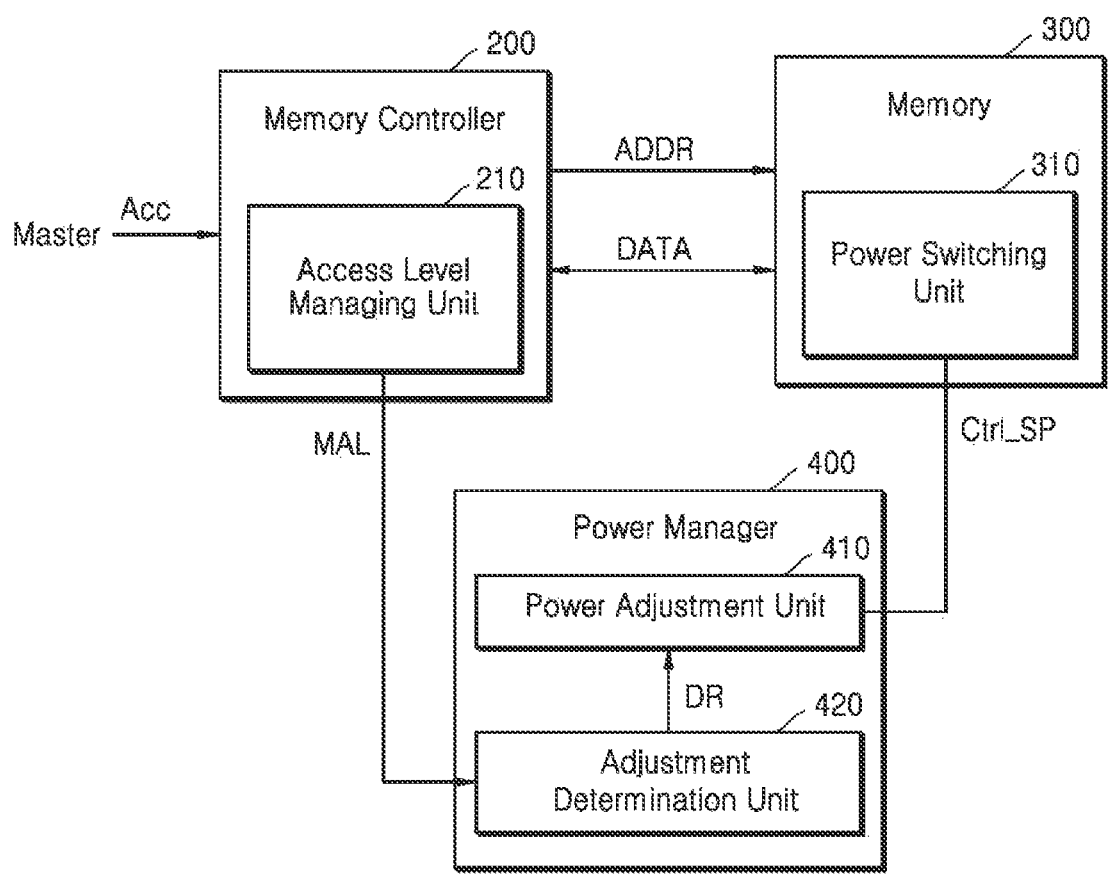
FIG. 2 illustrates a block diagram of an SoC, according to an embodiment.

FIG. 2 illustrates a block diagram of the SoC 10 according to an embodiment, and the corresponding descriptions provided with reference to FIG. 1 will not be repeated.

Referring to FIG. 2, the SoC 10 may include the memory controller 200, the memory 300, and the power manager 400. The memory controller 200 may include the ALMU 210. The memory 300 may include a power switching unit 310. The power manager 400 may include the power adjustment unit 410 and an adjustment determination unit 420.

The ALMU 210 may output a memory access level MAL to the adjustment determination unit 420 based on accesses Acc of masters (e.g., the first to $N^{th}$ masters 100_1 to 100_N of FIG. 1). The adjustment determination unit 420 may compare the memory access level MAL with at least one preset access level threshold and may output a determination result DR to the power adjustment unit 410. The determination result DR may include two or more states, depending on the number of access level thresholds. For example, when there is one access level threshold, the adjustment determination unit 420 may output a busy state Busy to the power adjustment unit 410 as the determination result DR if the memory access level MAL is higher than a first access level threshold. The adjustment determination unit 420 may output an idle state IDLE to the power adjustment unit 410 as the determination result DR if the memory access level MAL is lower than the first access level threshold.

The power adjustment unit 410 may receive the determination result DR and may output, to the power switching unit 310, a supply power control signal Ctrl_SP that differs depending on the determination result DR. For example, when receiving the busy state Busy as the determination result DR, the power adjustment unit 410 may output the supply power control signal Ctrl_SP for adjusting the supply power level to a first supply power level. When receiving the idle state IDLE as the determination result DR, the power adjustment unit 410 may output the supply power control signal Ctrl_SP for adjusting the supply power level to a second supply power level. In this case, the first supply power level may be higher than the second supply power level.

Based on the supply power control signal Ctrl_SP, the power switching unit 310 may adjust power supplied to the memory 300. To this end, the power switching unit 310 may include at least one switching device (e.g., a Metal Oxide Semiconductor (MOS) transistor) connected to a power source. For example, the power switching unit 310 may include a transistor including a gate, and the supply power control signal Ctrl_SP may be transmitted to the gate so as to control ON/OFF states of the transistor; thereby, a level of the power supplied to the memory 300 may be adjusted.

Figure 3:
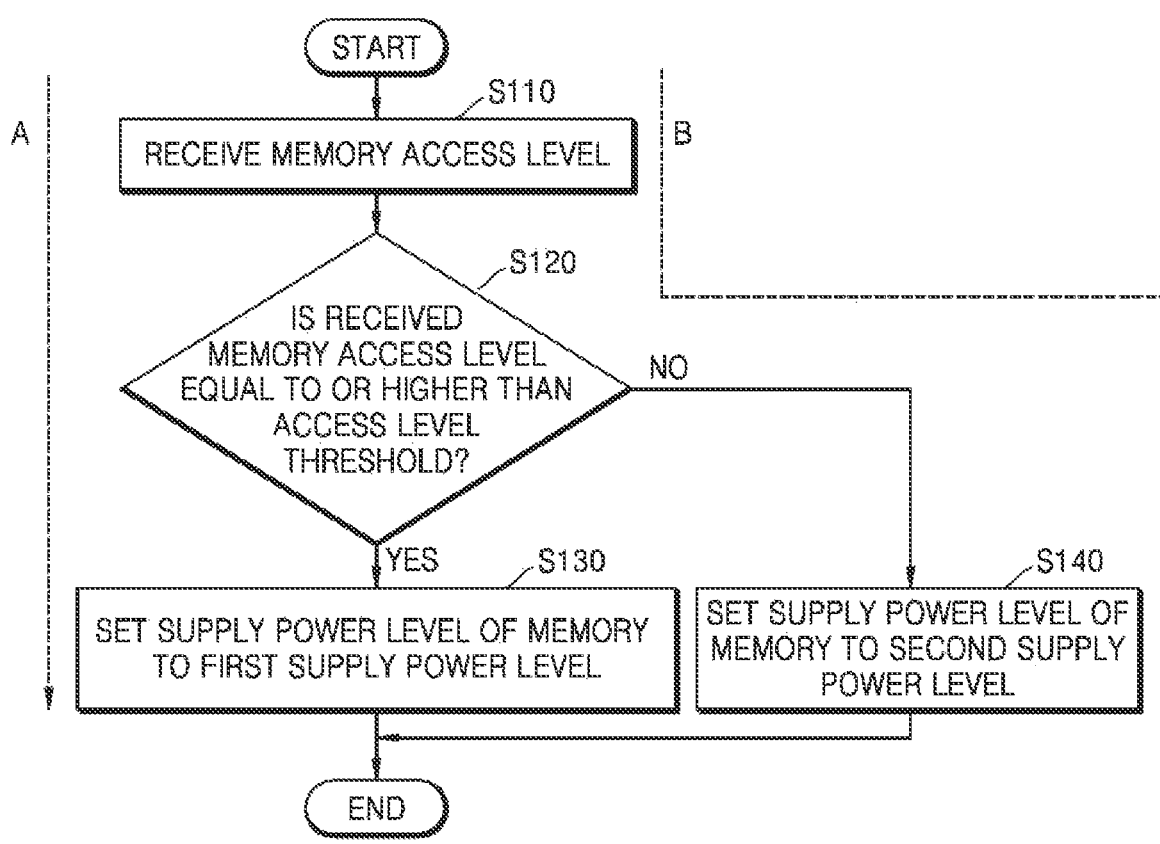
FIG. 3 illustrates a flowchart of an operation of a power manager, according to an embodiment.

FIG. 3 illustrates a flowchart of an operation of the power manager 400 according to an embodiment.

Referring to FIGS. 2 and 3, in operation S110, the adjustment determination unit 420 may receive the memory access level MAL from the ALMU 210. The adjustment determination unit 420 may compare the received memory access level MAL with the access level threshold.

When the memory access level MAL is determined to be higher than the access level threshold in operation S120, the power adjustment unit 410 may output the supply power control signal Ctrl_SP and may set the supply power level of the memory 300 as the first supply power level in operation S130. When the memory access level MAL is determined to be lower than the access level threshold in operation S120, the power adjustment unit 410 may output the supply power control signal Ctrl_SP and may set the supply power level of the memory 300 as the second supply power level in operation S140. According to an embodiment, the first supply power level may be higher than the second supply power level. That is, the power adjustment unit 410 may be configured to perform a process that includes setting the supply power level.

Figure 5:
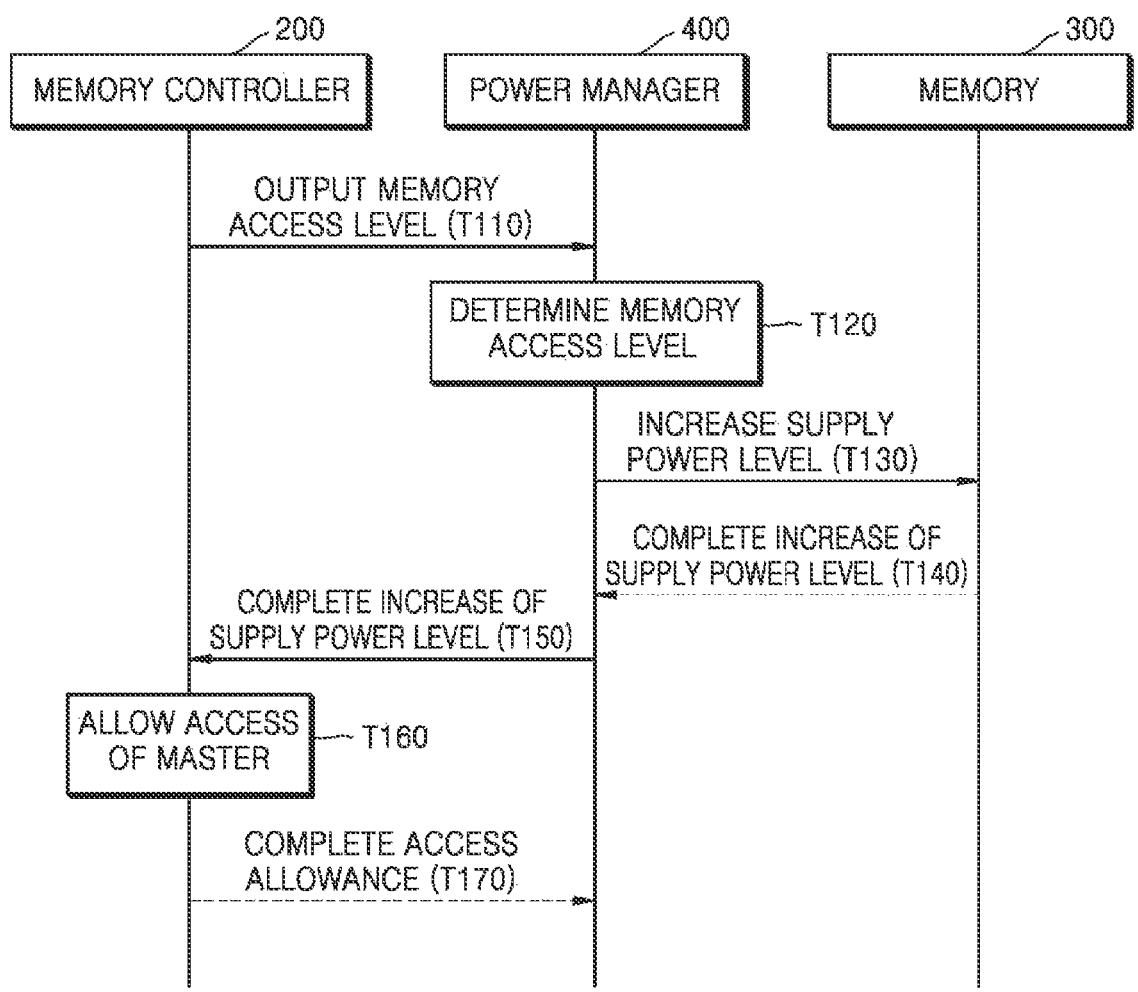
FIG. 5 illustrates a flowchart of a method of operating an SoC, according to an embodiment.

As in operations S110, S120, and S130 of FIG. 3, when the memory access level MAL is higher than the access level threshold, an operation of the power manager 400 is referred to as a first route A, and detailed descriptions thereof are provided with reference to FIG. 5. As in operations S110, S120, and S140 of FIG. 3, when the memory access level MAL is lower than the access level threshold, an operation of the power manager 400 is referred to as a second route B, and detailed descriptions thereof are provided with reference to FIGS. 6 and 7.

Figure 4:
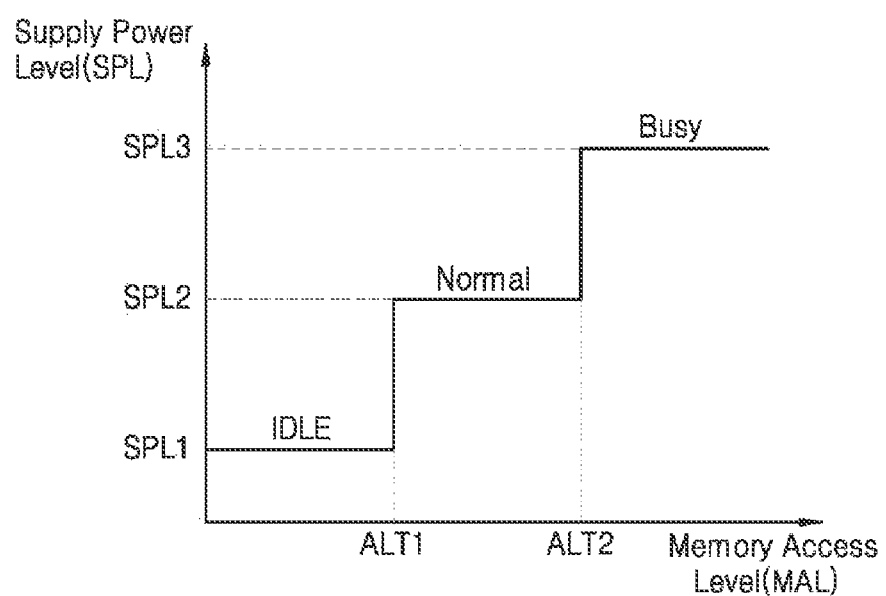
FIG. 4 is a graph illustrating a relationship between a supply power level and a memory access level, according to an embodiment.

FIG. 4 illustrates a graph showing a relationship between a supply power level SPL and a memory access level MAL, according to an embodiment. In detail, FIG. 4 illustrates an embodiment in which there are two access level thresholds, that is, a first access level threshold ALT1 and a second access level threshold ALT2.

Referring to FIGS. 2 and 4, the adjustment determination unit 420 may receive the memory access level MAL from the ALMU 210. The memory access level MAL may have consecutive values. The adjustment determination unit 420 may compare the received memory access level MAL with the first access level threshold ALT1 and the second access level threshold ALT2.

When the memory access level MAL is lower than the first access level threshold ALT1, the adjustment determination unit 420 may output the idle state IDLE to the power adjustment unit 410 as the determination result DR. Then, the power adjustment unit 410 may output a supply power control signal Ctrl_SP corresponding to a first supply power level SPL1 to the power switching unit 310. In response to the supply power control signal Ctrl_SP, the power switching unit 310 may adjust the power supplied to the memory 300 to be at the first supply power level SPL1.

When the memory access level MAL is higher than the first access level threshold ALT1 but lower than the second access level threshold ALT2, the adjustment determination unit 420 may output a normal state Normal to the power adjustment unit 410 as the determination result DR. Then, the power adjustment unit 410 may output the supply power control signal Ctrl_SP to the power switching unit 310, wherein the supply power control signal Ctrl_SP corresponds to a second supply power level SPL2 higher than the first supply power level SPL1. In response to the supply power control signal Ctrl_SP, the power switching unit 310 may adjust the power supplied to the memory 300 to be at the second supply power level SPL2.

When the memory access level MAL is higher than the second access level threshold ALT2, the adjustment determination unit 420 may output the busy state Busy to the power adjustment unit 410 as the determination result DR. Then, the power adjustment unit 410 may output the supply power control signal Ctrl_SP to the power switching unit 310, wherein the supply power control signal Ctrl_SP corresponds to a third supply power level SPL3 higher than the second supply power level SPL2. In response to the supply power control signal Ctrl_SP, the power switching unit 310 may adjust the power supplied to the memory 300 to be at the third supply power level SPL3.

FIG. 4 illustrates an embodiment in which there are two access level thresholds. However, there may be one access level threshold or at least three access level thresholds.

FIG. 5 illustrates a flowchart of a method of operating the SoC 10, according to an embodiment. In detail, FIG. 5 is a flowchart of a method of operating the SoC 10 with regard to the first route A of FIG. 3. That is, the method of operating the SoC 10, in which the memory access level MAL is higher than the access level threshold, will be described.

Referring to FIGS. 2, 3, and 5, operation T110 is performed in which the memory controller 200 may output the memory access level MAL to the power manager 400. In operation T120, the power manager 400 may determine the memory access level MAL by using the method described with reference to FIGS. 2 to 4. When it is determined that the memory access level MAL is higher than the access level threshold, operation T130 may be performed in which the power manager 400 may output, to the memory 300, the supply power control signal Ctrl_SP for increasing the supply power level to the first supply power level. In operation T140, the memory 300 may selectively output, to the power manager 400, a signal indicating that an increase of the supply power level is completed. The signal indicating that an increase of the supply power level is completed may be a power increase completion signal. When the increase of the supply power level of the memory 300 is completed, operation T150 may be performed in which the power manager 400 may output, to the memory controller 200, the signal indicating that the increase of the supply power level is completed. In response to the signal, the memory controller 200 may allow masters to access the memory 300 in operation T160. Then, in operation T170, the memory controller 200 may selectively output, to the power manager 400, a signal indicating that the access to the memory 300 has been allowed. Operations, e.g., operations T140 and T170, which are indicated by dashed lines, may be selectively performed.

Figure 6:
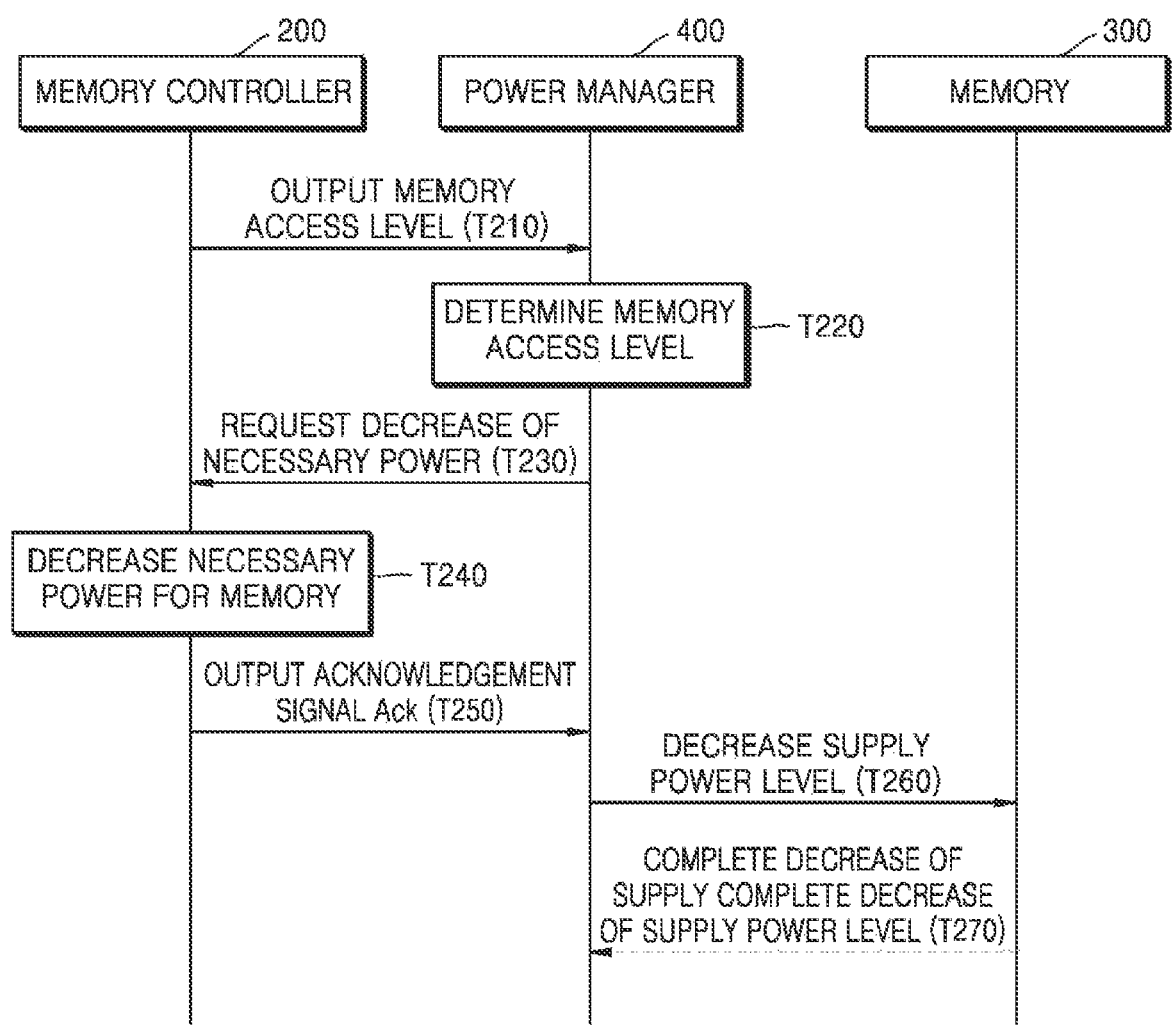
FIG. 6 illustrates a flowchart of a method of operating an SoC, according to an embodiment.

FIG. 6 illustrates a flowchart of a method of operating the SoC 10, according to an embodiment. In detail, FIG. 6 is a flowchart of another method of operating the SoC 10 with regard to the second route B of FIG. 3.

Referring to FIGS. 2, 3, and 6, operation T210 is performed in which the memory controller 200 may output the memory access level MAL to the power manager 400. In operation T220, the power manager 400 may determine the memory access level MAL by using the method described with reference to FIGS. 2 to 4. When it is determined that the memory access level MAL is lower than the access level threshold, operation T230 may be performed in which the power manager 400 may output, to memory controller 200, a signal for decreasing necessary power. The necessary power may be required to perform operations regarding the memory 300.

In operation T240, the memory controller 200 may decrease the necessary power for the memory 300 in response to the above signal. A method, by which the memory controller 200 decreases the necessary power for the memory 300, will be described in detail with reference to FIGS. 8 to 10. After the decrease of the necessary power for the memory 300 has been completed, operation T250 may be performed in which the memory controller 200 may output an acknowledgement signal Ack to the power manager 400.

In response to the acknowledgement signal Ack, operation T260 is performed in which the power manager 400 may output, to the memory 300, the supply power control signal Ctrl_SP for decreasing the supply power level to the second supply power level. In operation T270, the memory 300 may selectively output, to the power manager 400, a signal indicating the completion of the decrease of the supply power level. An operation, e.g., operation T270, which is indicated by a dashed line, may be selectively performed.

Figure 7:
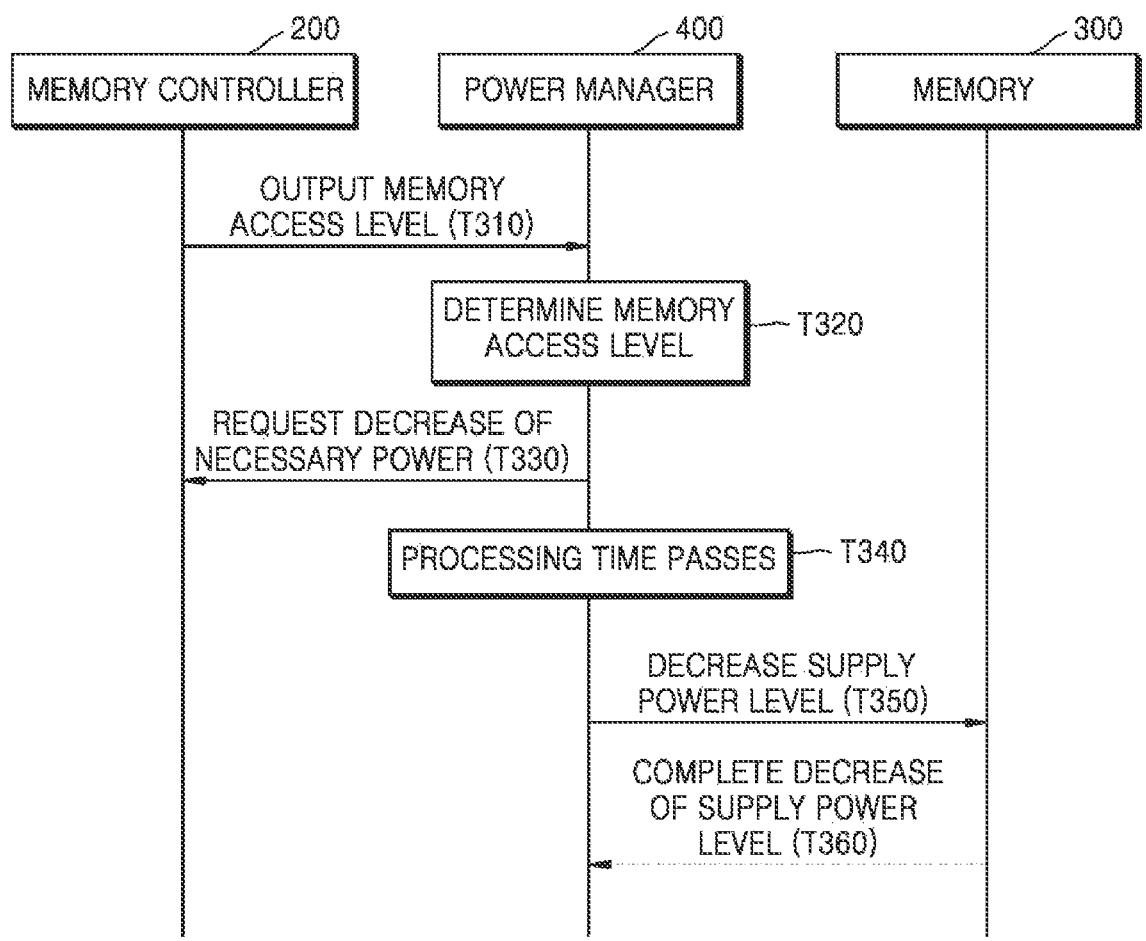
FIG. 7 illustrates a flowchart of a method of operating an SoC, according to an embodiment.

FIG. 7 illustrates a flowchart of a method of operating the SoC 10, according to an embodiment. In detail, FIG. 7 is a flowchart of another method of operating the SoC 10 with regard to the second route B of FIG. 3.

Referring to FIGS. 2, 3, and 7, operation T310 is performed in which the memory controller 200 may output the memory access level MAL to the power manager 400. In operation T320, the power manager 400 may determine the memory access level MAL by using the method described with reference to FIGS. 2 to 4. When it is determined that the memory access level MAL is lower than the access level threshold, operation T330 is performed in which the power manager 400 may output, to memory controller 200, a signal for decreasing necessary power. A preset period of processing time passes in operation T340. Then operation T350 is performed in which the power manager 400 may output, to the memory 300, the supply power control signal Ctrl_SP for decreasing the supply power level to the second supply power level in response to the signal for decreasing the necessary power. The processing time in operation T340 may be a time necessary for the memory controller 200 to decrease the power necessary for the memory 300. For example, the processing time may be a time necessary to perform operation T240 of FIG. 6. In operation T360, the memory 300 may selectively output, to the power manager 400, a signal indicating the completion of the decrease of the supply power level. An operation, e.g., operation T360, which is indicated by a dashed line, may be selectively performed.

Figure 8:
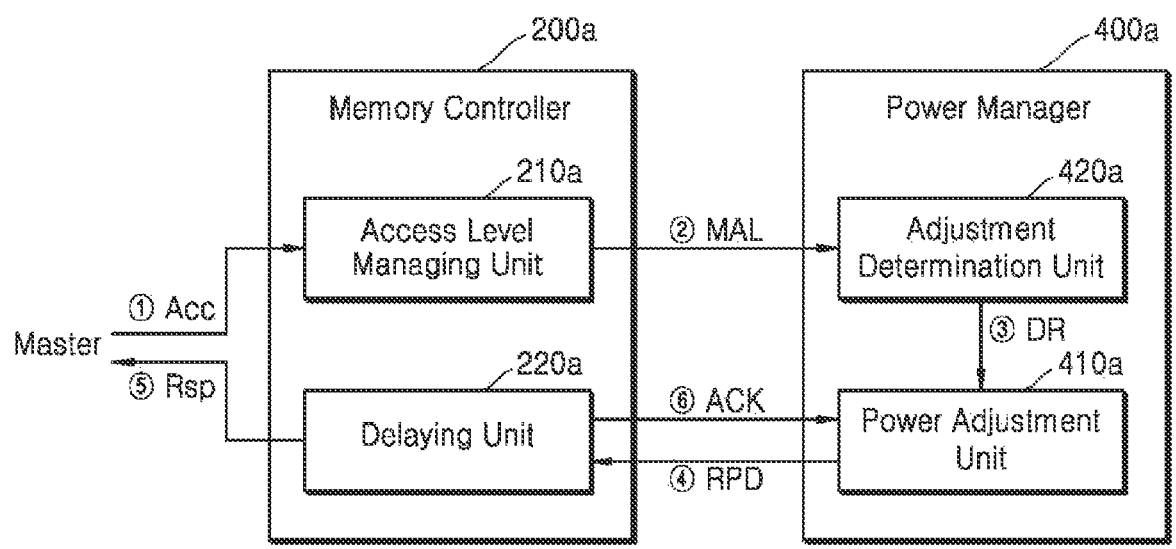
FIG. 8 illustrates a block diagram of an SoC, according to an embodiment.

FIG. 8 illustrates a block diagram of an SoC 10a according to an embodiment. In detail, FIG. 8 is a block diagram of a method of operating the SoC 10a with regard to the second route B of FIG. 3. That is, a method of operating the SoC 10a, in which a memory access level MAL is lower than an access level threshold, will be described.

Referring to FIGS. 6 and 8, the SoC 10a may include a memory controller 200a and a power manager 400a. The memory controller 200a may include an ALMU 210a and a delaying unit 220a. The power manager 400a may include a power adjustment unit 410a and an adjustment determination unit 420a.

When detecting accesses Acc of masters (e.g., the first to $N^{th}$ masters 100_1 to 100_N) to a memory (e.g., the memory 300 of FIG. 2), the ALMU 210a may generate a memory access level MAL. The ALMU 210a may output the generated memory access level MAL to the adjustment determination unit 420a. The adjustment determination unit 420a may output, to the power adjustment unit 410a, the determination result DR (e.g., the idle state IDLE of FIG. 4) indicating that the memory access level MAL is lower than the access level threshold.

In response to the determination result DR, the power adjustment unit 410a may output a necessary power decrease request signal RPD to the delaying unit 220a, as in operation T230 of FIG. 6. In response to the necessary power decrease request signal RPD, the delaying unit 220a may delay a response Rsp corresponding to the accesses Acc of the masters and may output the response Rsp. The masters may receive the response Rsp from the memory controller 200a and then may request to access the memory. Thus, when the delaying unit 220a delays and outputs the response Rsp regarding the masters, access frequencies of the masters may decrease. Accordingly, the necessary power for the memory may decrease. After the necessary power decreases due to the delayed response Rsp, the delaying unit 220a may output an acknowledgement signal Ack to the power adjustment unit 410a. After receiving the acknowledgement signal Ack, the power adjustment unit 410a may adjust the power supplied to the memory to be at a low level.

Figure 9:
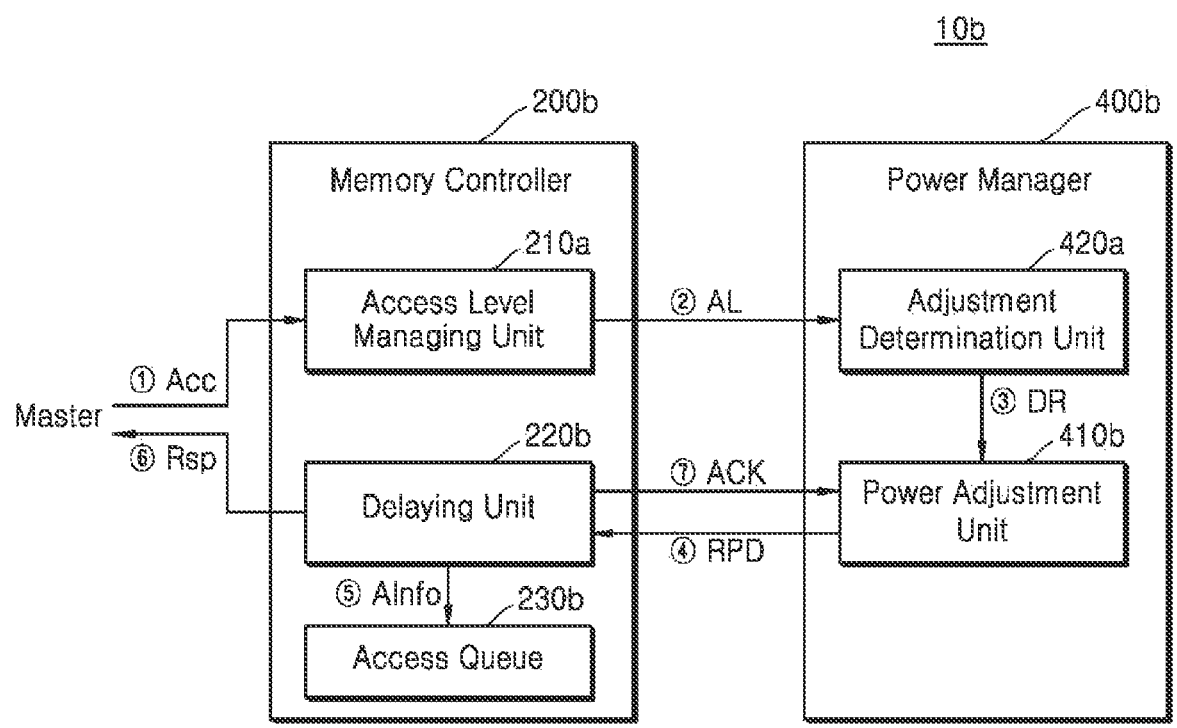
FIG. 9 illustrates a block diagram of an SoC, according to an embodiment.

FIG. 9 illustrates a block diagram of an SoC 10b according to an embodiment. In detail, FIG. 9 is a block diagram of a method of operating the SoC 10b with regard to the second route B of FIG. 3. That is, the method of operating the SoC 10b, in which the memory access level MAL is less than the access level threshold, will be described.

Referring to FIGS. 6 and 9, the SoC 10b may include a memory controller 200b and a power manager 400b. The memory controller 200b may include an ALMU 210b, a delaying unit 220b, and an access queue 230b. The power manager 400b may include a power adjustment unit 410b and an adjustment determination unit 420b.

When detecting accesses Acc of masters (e.g., the first to $N^{th}$ masters 100_1 to 100_N) to a memory (e.g., the memory 300 of FIG. 2), the ALMU 210b may generate the memory access level MAL. The ALMU 210b may output the generated memory access level MAL to the adjustment determination unit 420b. The adjustment determination unit 420b may output, to the power adjustment unit 410b, the determination result DR (e.g., the idle state IDLE of FIG. 4) indicating that the memory access level MAL is less than the access level threshold.

In response to the determination result DR, the power adjustment unit 410b may output a necessary power decrease request signal RPD to the delaying unit 220b, as in operation T230 of FIG. 6. In response to the necessary power decrease request signal RPD, the delaying unit 220b may store, in the access queue 230b, access information AInfo regarding the accesses Acc of the masters, unlike the embodiment of FIG. 8. As the memory controller 200b stores the access information AInfo in the access queue 230b instead of immediately performing, on the memory, an operation corresponding to the accesses Acc, the necessary power for the memory may be reduced. Operations according to the stored access information AInfo may be sequentially performed later. After the necessary power is reduced due to an operation regarding the response Rsp, the delaying unit 220b may output an acknowledgement signal Ack to the power adjustment unit 410b. After receiving the acknowledgement signal Ack, the power adjustment unit 410b may adjust the power supplied to the memory to be at a low level.

Figure 10:
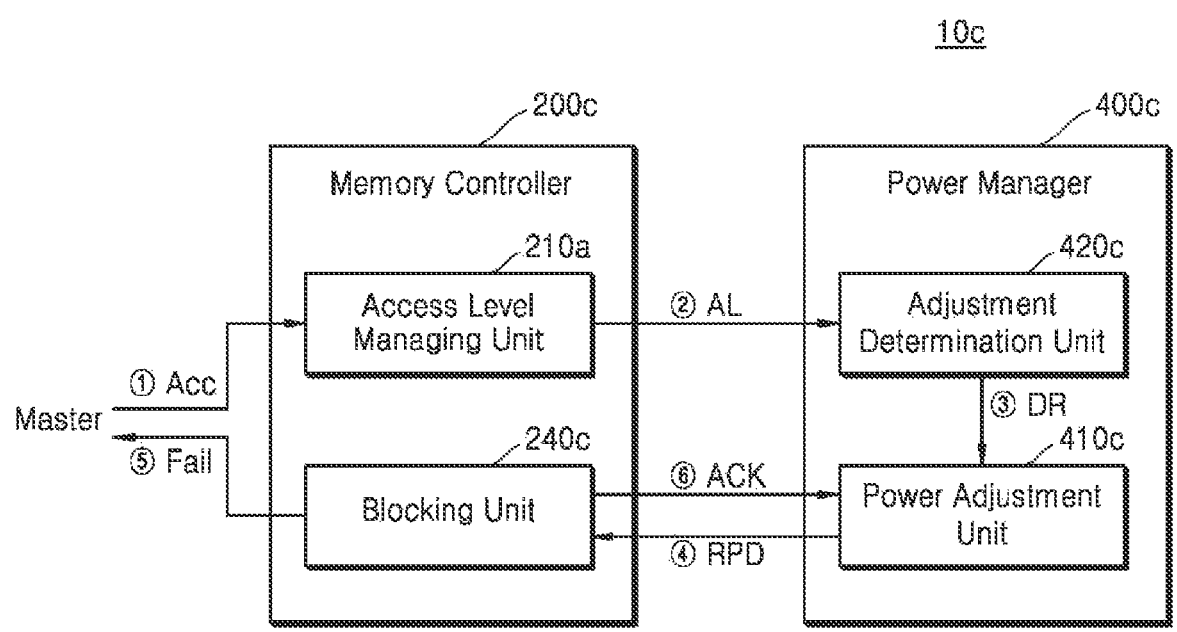
FIG. 10 illustrates a block diagram of an SoC, according to an embodiment.

FIG. 10 illustrates a block diagram of an SoC 10c according to an embodiment. In detail, FIG. 10 is a block diagram of a method of operating the SoC 10c with regard to the second route B of FIG. 3. That is, the method of operating the SoC 10c, in which a memory access level MAL is lower than an access level threshold, will be described.

Referring to FIGS. 6 and 10, the SoC 10c may include a memory controller 200c and a power manager 400c. The memory controller 200c may include an ALMU 210c and a blocking unit 240c. The power manager 400c may include a power adjustment unit 410c and an adjustment determination unit 420c.

When detecting accesses Acc of masters (e.g., the first to $N^{th}$ masters 100_1 to 100_N) to a memory (e.g., the memory 300 of FIG. 2), the ALMU 210c may generate a memory access level MAL. The ALMU 210c may output the generated memory access level MAL to the adjustment determination unit 420c. The adjustment determination unit 420c may output, to the power adjustment unit 410c, the determination result DR (e.g., the idle state IDLE of FIG. 4) indicating that the memory access level MAL is lower than the access level threshold.

In response to the determination result DR, the power adjustment unit 410c may output a necessary power decrease request signal RPD to the blocking unit 240c as in operation T230 of FIG. 6. In response to the necessary power decrease request signal RPD, the blocking unit 240c may output a fail signal Fail to the masters. When the blocking unit 240c outputs the fail signal Fail in response to the accesses Acc of the masters, the masters may request to access the memory again. Accordingly, access frequencies of the masters may decrease. Thus, the necessary power for the memory may decrease. After the necessary power for the memory decreases due to a blocking operation, the blocking unit 240c may output an acknowledgement signal Ack to the power adjustment unit 410c. After receiving the acknowledgement signal Ack, the power adjustment unit 410c may adjust the power supplied to the memory to be at a low level.

Figure 11:
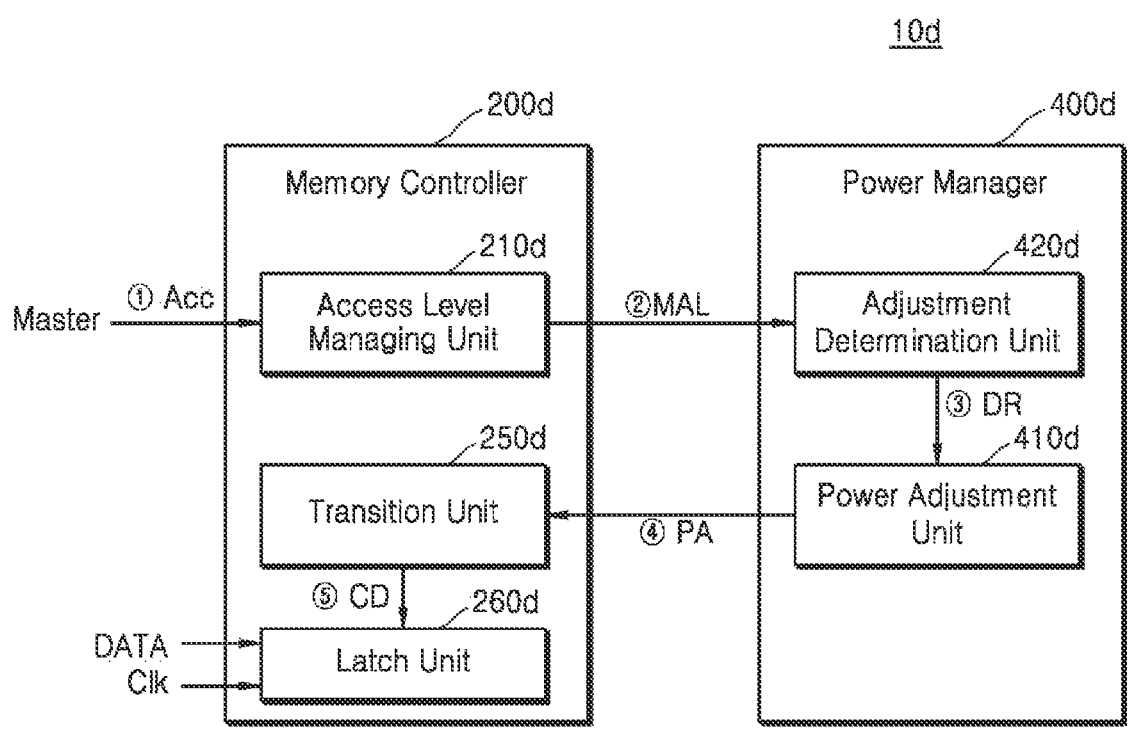
FIG. 11 illustrates a block diagram of an SoC, according to an embodiment.

FIG. 11 illustrates a block diagram of an SoC 10d according to an embodiment, and corresponding descriptions provided with reference to FIG. 2 will not be repeated.

Referring to FIG. 11, the SoC 10d may include a memory controller 200d and a power manager 400d. The memory controller 200d may include an ALMU 210d, a transition unit 250d, and a latch unit 260d. The power manager 400d may include a power adjustment unit 410d and an adjustment determination unit 420d.

When detecting accesses Acc of masters (e.g., the first to $N^{th}$ masters 100_1 to 100_N) to a memory (e.g., the memory 300 of FIG. 2), the ALMU 210d may generate a memory access level MAL. The ALMU 210d may output the generated memory access level MAL to the adjustment determination unit 420d. The adjustment determination unit 420d may compare the memory access level MAL with an access level threshold and may output the determination result DR to the power adjustment unit 410d.

The power adjustment unit 410d may output a power adjustment signal PA to the transition unit 250d before outputting a supply power control signal (e.g., the supply power control signal Ctrl_SP of FIG. 2) regarding the memory. The power adjustment signal PA may include information indicating that power supplied to the memory is adjusted by the power adjustment unit 410d. That is, by outputting the power adjustment signal PA to the transition unit 250d, the power adjustment unit 410d may notify the transition unit 250d that the power supplied to the memory is adjusted. In response to the power adjustment signal PA, the transition unit 250d may output a clock inactivation signal CD to the latch unit 260d. In response to the clock inactivation signal CD, the latch unit 260d may inactivate a received clock Clk.

Figure 12:
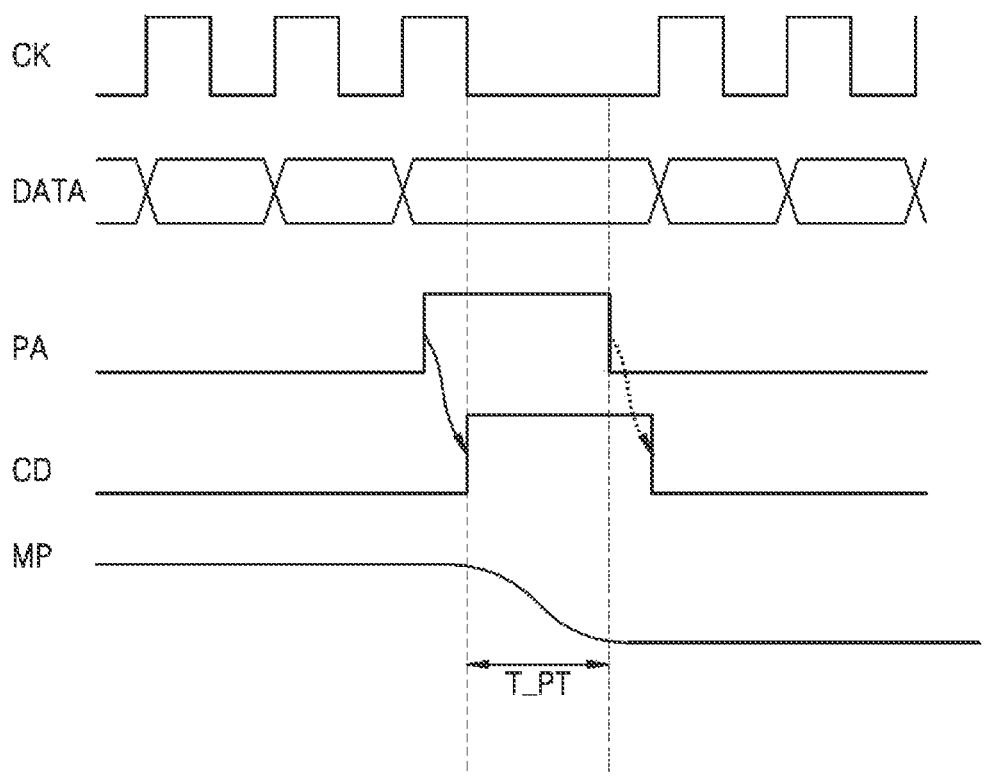
FIG. 12 illustrates a timing diagram of a memory power transition interval of an SoC, according to an embodiment.

FIG. 12 illustrates a timing diagram of a memory power transition interval T_PT of an SoC, according to an embodiment.

Referring to FIGS. 11 and 12, before outputting a supply power control signal (e.g., the supply power control signal Ctrl_SP of FIG. 2) regarding the memory, the power adjustment unit 410d may output the power adjustment signal PA to the transition unit 250d. In response to the power adjustment signal PA, the transition unit 250d may output the clock inactivation signal CD to the latch unit 260d. In response to the clock inactivation signal CD, the latch unit 260d may inactivate a clock Ck during the memory power transition interval T_PT in which a level of memory supply power MP changes.

Since the level of the memory supply power MP changes in the memory power transition interval T_PT, a problem may occur with regard to reliability of received data DATA. Thus, the transition unit 250d may inactivate the clock Ck so that the latch unit 260d may not receive data DATA during the memory power transition interval T_PT. After the memory power transition interval T_PT ends, the power adjustment unit 410d may stop outputting the power adjustment signal PA. In response to a halt of the output, the transition unit 250d may stop outputting the clock inactivation signal CD to the latch unit 260d. Accordingly, the latch unit 260d may activate the clock Ck again after the memory power transition interval T_PT and may receive the data DATA again.

Figure 13:
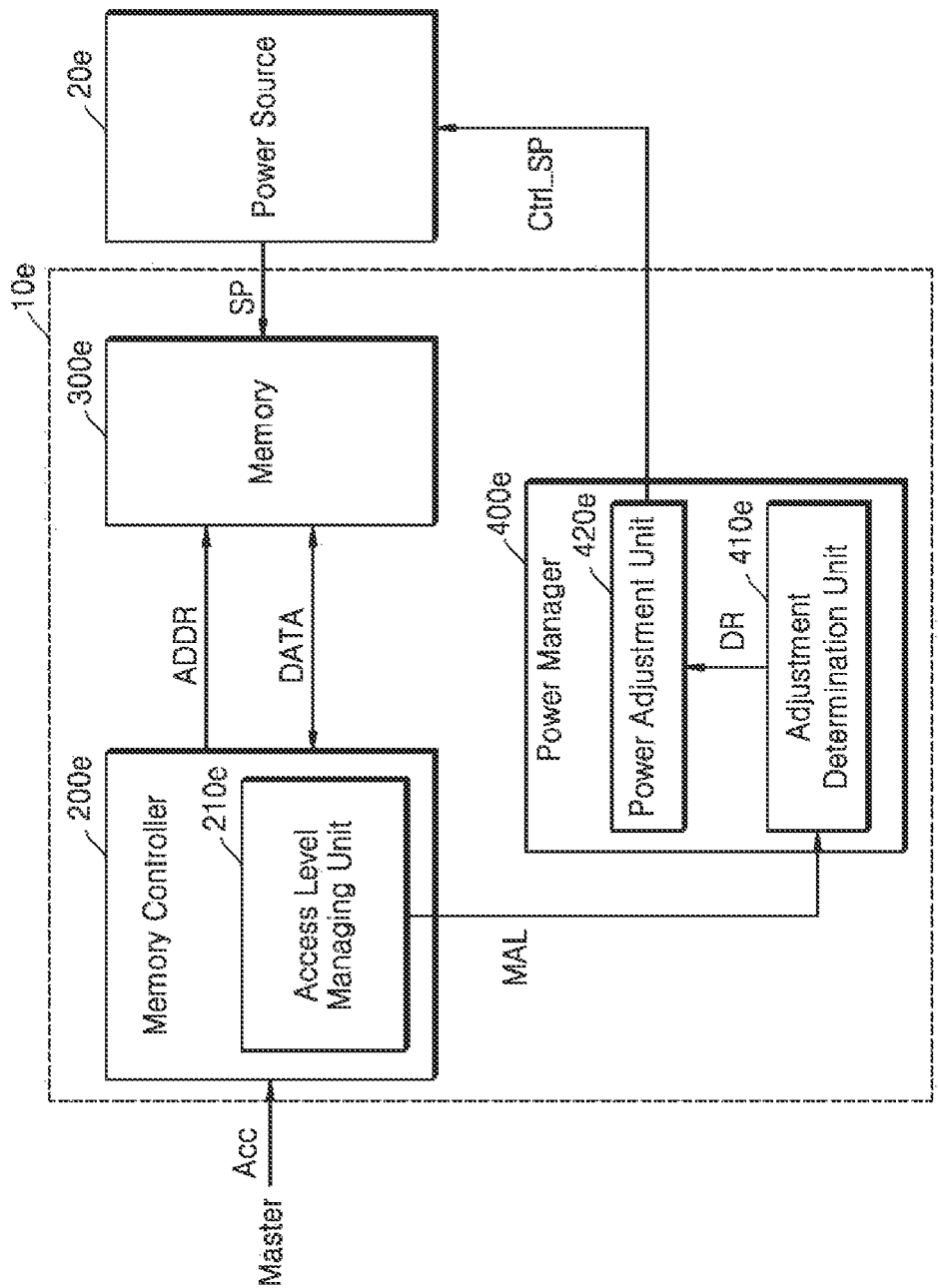
FIG. 13 illustrates a block diagram of a memory system, according to an embodiment.

FIG. 13 illustrates a block diagram of a memory system 1e according to an embodiment, and the corresponding descriptions provided with reference to FIG. 2 will not be repeated.

Referring to FIG. 13, the memory system 1e may include an SoC 10e and a power source 20e. The SoC 10e may include a memory controller 200e, a memory 300e, and a power manager 400e. The SoC 10e may be substantially the same as or similar to the SoC 10 of FIG. 2 except in respect of a power adjustment unit 420e that outputs the supply power control signal Ctrl_SP to the power source 20e instead of the memory 300e. The power source 20e is configured to supply power to the memory 300e.

The power adjustment unit 420e may generate the supply power control signal Ctrl_SP based on the determination result DR received from an adjustment determination unit 410e and may output the generated supply power control signal Ctrl_SP to the power source 20e. The power source 20e may provide the SoC 10e with supply power SP having at least one level. For example, the power source 20e may be embodied as a Power Management Integrated Circuit (PMIC). In response to the supply power control signal Ctrl_SP, the power source 20e may adjust a level of the supply power SP supplied to the memory 300e. When the supply power control signal Ctrl_SP is a signal for adjusting the supply power SP to have a first supply power level, the power source 20e may adjust the supply power SP supplied to the memory 300e to have the first supply power level. When the supply power control signal Ctrl_SP is a signal for adjusting the supply power SP to have a second supply power level, the power source 20e may adjust the supply power SP supplied to the memory 300e to have the second supply power level.

Figure 14:
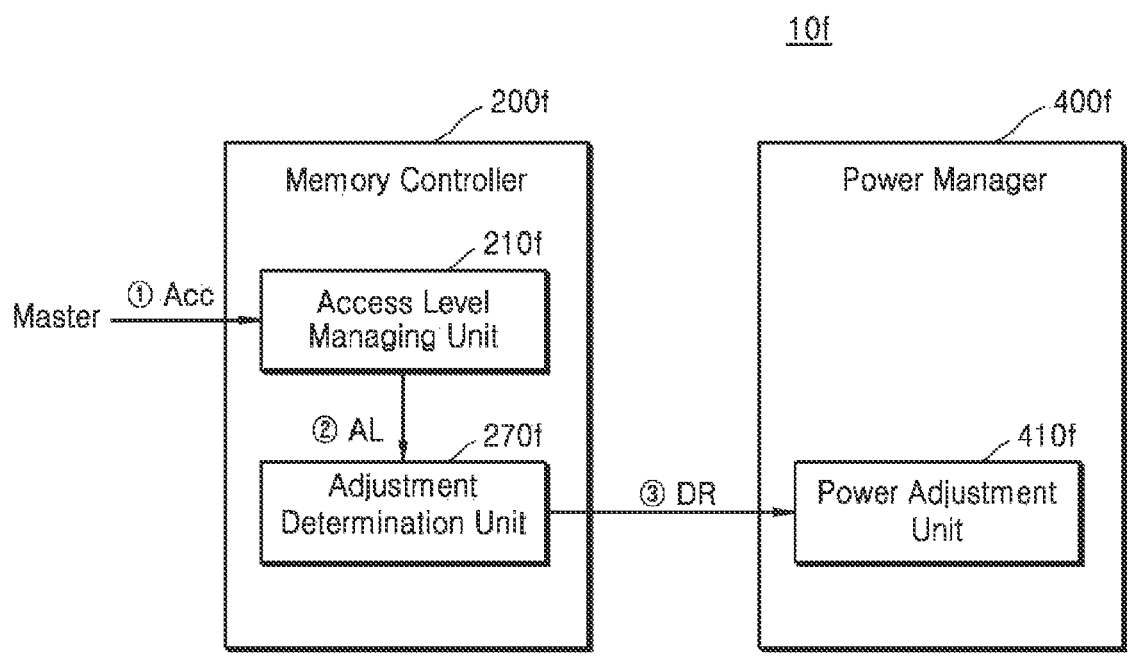
FIG. 14 illustrates a block diagram of an SoC, according to an embodiment.

FIG. 14 illustrates a block diagram of an SoC 10f according to an embodiment, and the corresponding descriptions provided with reference to FIG. 2 will not be repeated.

Referring to FIG. 14, the SoC 10f may include a memory controller 200f and a power manager 400f. The memory controller 200f may include an ALMU 210f and an adjustment determination unit 270f. The power manager 400f may include a power adjustment unit 410f. The SoC 10f may be substantially the same as or similar to the SoC 10 of FIG. 2 except in respect of the adjustment determination unit 270f included in the memory controller 200f.

The ALMU 210f may detect accesses Acc of masters (e.g., the first to $N^{th}$ masters 100_1 to 100_N) to a memory and may generate a memory access level MAL. The ALMU 210f may output the memory access level MAL to the adjustment determination unit 270f included in the memory controller 200f. To this end, the adjustment determination unit 270f may be included in each voltage domain (e.g., the first voltage domain 11 and second voltage domain 12 of FIG. 1). The adjustment determination unit 270f may compare the memory access level MAL with access level thresholds (e.g., the first access level threshold ALT1 and the second access level threshold ALT2) and may output the determination result DR to the power adjustment unit 410f included in the power manager 400f.

Figure 15:
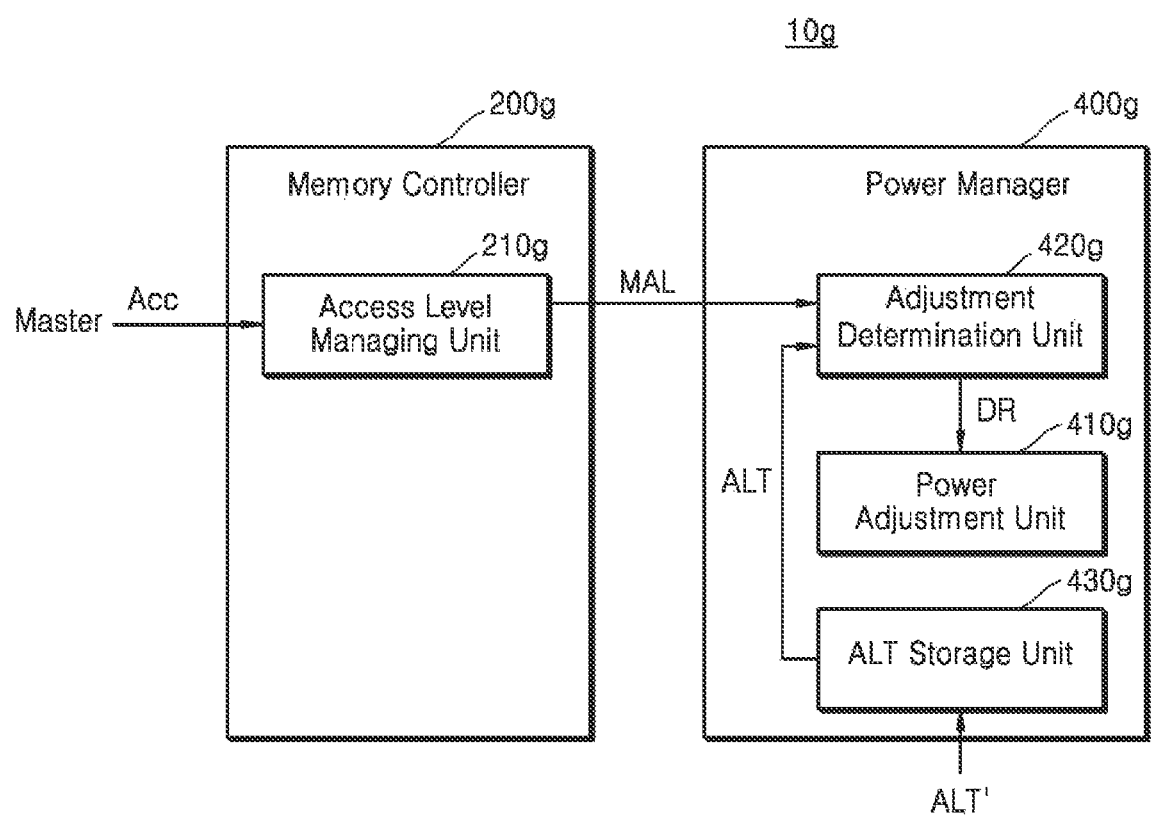
FIG. 15 illustrates a block diagram of an SoC, according to an embodiment.

FIG. 15 illustrates a block diagram of an SoC 10g according to an embodiment, and the corresponding descriptions provided with reference to FIG. 2 will not be repeated.

Referring to FIG. 15, the SoC 10g may include a memory controller 200g and a power manager 400g. The memory controller 200g may include an ALMU 210g. The power manager 400g may include a power adjustment unit 410g, an adjustment determination unit 420g, and an access level threshold (ALT) storage unit 430g. The ALMU 210g, the power adjustment unit 410g, and the adjustment determination unit 420g may be substantially the same as or similar to the ALMU 210, the power adjustment unit 410, and the adjustment determination unit 420 of FIG. 2, respectively.

The ALT storage unit 430g may store an access level threshold ALT. To this end, the ALT storage unit 430g may include a volatile memory such as an SRAM, a DRAM, a latch, a Flip-Flop, or a register, or a non-volatile memory such as a NAND Flash Memory, a VNAND, a NOR Flash Memory, an RRAM, a PRAM, an MRAM, an FRAM, or an STT-RAM.

The ALT storage unit 430g may output the access level threshold ALT to the adjustment determination unit 420g. The adjustment determination unit 420g may compare the access level threshold ALT with a memory access level MAL and may output the determination result DR to the power adjustment unit 410g. In an embodiment, the ALT storage unit 430g may store at least one access level threshold ALT. For example, the ALT storage unit 430g may store a first access level threshold and a second access level threshold and may output the first access level threshold and the second access level threshold to the adjustment determination unit 420g. The adjustment determination unit 420g may compare the memory access level MAL with both the first access level threshold and the second access level threshold and may output different determination results DR to the power adjustment unit 410g.

In an embodiment, the ALT storage unit 430g may receive an access level threshold ALT' that is changed by a host, etc. The ALT storage unit 430g may store the changed access level threshold ALT' and may output the stored access level threshold ALT' to the adjustment determination unit 420g. In response to the output, the adjustment determination unit 420g may generate the determination result DR by comparing the access level threshold ALT' with the memory access level MAL and may output the determination result DR to the power adjustment unit 410g.

Figure 16:
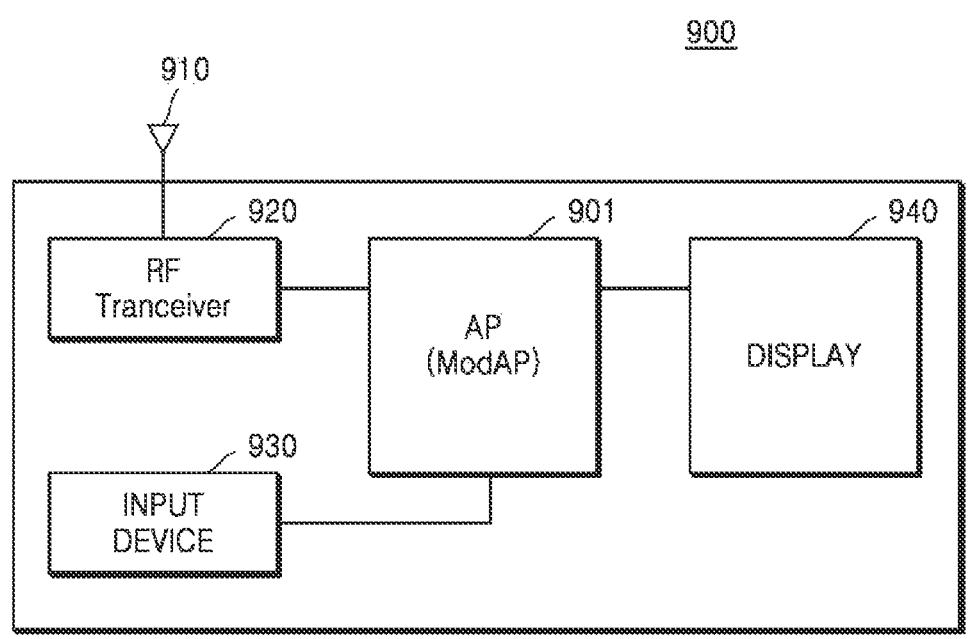
FIG. 16 illustrates a block diagram of an example of a semiconductor system including an SoC, according to an embodiment.

FIG. 16 illustrates a block diagram of an example of a semiconductor system 900 including an SoC, according to an embodiment.

Referring to FIG. 16, the semiconductor system 900 may include an Application Processor (AP) 901, an antenna 910, a radio frequency (RF) transceiver 920, an input device 930, and a display 940. The AP 901 may be a Modem AP (ModAP) having a modem function. According to an embodiment, the AP 901 may include any SoC described with reference to FIGS. 1 to 15. In other words, the AP 901 may adjust power supplied to the memory, according to a frequency of accesses to the memory included in the AP 901. The frequency of accesses may correspond to the number of accesses over a specified fixed time period, such as over a second, minute, hour, day, or year. Alternatively, the frequency of accesses may correspond to the number of accesses between particular events, such as an event that starts a clock and the current time.

The RF transceiver 920 may exchange wireless signals with an external device via the antenna 910. For example, the RF transceiver 920 may convert the wireless signals, which are exchanged via the antenna 910, into signals that may be processed by the AP 901. Therefore, the AP 901 may process signals output from the RF transceiver 920 and may transmit the processed signals to the display 940.

Also, the RF transceiver 920 may convert signals, which are output from the AP 901, into wireless signals and may output the wireless signals to an external device via the antenna 910. The input device 930 may be a device used to input control signals for controlling an operation of the AP 901 or data to be processed by the AP 901. The input device 930 may be embodied as a keypad, a keyboard, or a pointing device such as a touch pad or a computer mouse.

The descriptions herein refer to a variety of units, controllers and managers. Any of these units, controllers and managers may be embodied by a processor that executes a particular dedicated set of software instructions, such as a software module. The processor executes the instructions to control operations of the units, controllers and managers. Multiple of the units, controllers and managers may be defined by a single common processor and different dedicated sets of software instructions. Any processor of a unit, controller or manager described herein is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A processor is an article of manufacture and/or a machine component. A processor is configured to execute software instructions in order to perform functions as described in the various embodiments herein. A processor may be a general-purpose processor or may be part of an application specific integrated circuit (ASIC). A processor may also be a microprocessor, a microcomputer, a processor chip, a controller, a microcontroller, a digital signal processor (DSP), a state machine, or a programmable logic device. A processor may also be a logical circuit, including a programmable gate array (PGA) such as a field programmable gate array (FPGA), or another type of circuit that includes discrete gate and/or transistor logic. A processor may be a central processing unit (CPU), a graphics processing unit (GPU), or both. Additionally, any processor described herein may include multiple processors, parallel processors, or both. Multiple processors may be included in, or coupled to, a single device or multiple devices. Sets of instructions can be read from a computer-readable medium. Further, the instructions, when executed by a processor, can be used to perform one or more of the methods and processes as described herein. In a particular embodiment, the instructions may reside completely, or at least partially, within a main memory, a static memory, and/or within a processor during execution.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

While the inventive concepts of the present disclosure have been particularly shown and described with reference to embodiments thereof, it will be understood that various changes in form and details may be made therein without departing from the spirit and scope of the following claims.

What is claimed is:

1. A method of operating a system on chip (SOC) including a memory, a memory controller, and a power manager, the method comprising:
    by the power manager, receiving a memory access level indicating a frequency of accesses to the memory from the memory controller;
    by the power manager, determining whether the memory access level is included in any one of a plurality of access level ranges; and
    by the power manager, outputting a control signal to the memory, depending on whether the memory access level is included in the any one of the plurality of access level ranges, wherein the control signal is to manage a supply power level of the memory through a handshake with the memory controller.

2. The method of claim 1, wherein the plurality of access level ranges includes a first access level range of less than a first reference access level, a second access level range from the first reference access level to a second reference access level, and a third access level range above the second reference access level,
    wherein the memory access level is included in the first access level range,
    wherein the method further comprises:
    by the power manager, outputting a power decrease request signal to the memory controller;
    by the memory controller, decreasing the supply power level of the memory corresponding to the power decrease request signal; and
    by the memory controller, outputting an acknowledgement signal to the power manager, and
    wherein the outputting the control signal is characterized by outputting a signal to decrease the supply power level of the memory corresponding to the acknowledgement signal.

3. The method of claim 2, wherein the decreasing the supply power level of the memory is characterized by delaying outputting a response corresponding to an access of a master to the master.

4. The method of claim 2, wherein the decreasing the supply power level of the memory is characterized by storing access information corresponding to an access of a master in an access queue.

5. The method of claim 2, wherein the decreasing the supply power level of the memory is characterized by outputting a fail signal in response to an access of a master to the master.

6. The method of claim 1, wherein the plurality of access level ranges includes a first access level range of less than a first reference access level, a second access level range from the first reference access level to a second reference access level, and a third access level range above the second reference access level,
    wherein the memory access level is included in the third access level range,
    wherein the outputting the control signal is characterized by outputting a signal to increase the supply power level of the memory to the memory, and
    wherein the method further comprises:
    by the power manager, after the signal to increase the supply power level of the memory is output, outputting a signal indicating that an increase of the supply power level of the memory is completed to the memory controller.

7. The method of claim 6, further comprising:
by the memory controller, allowing an access of a master.

8. A method of operating a system on chip (SOC) including a memory, a memory controller, and a power manager, the method comprising:
by the power manager, receiving a memory access level indicating a frequency of accesses to the memory from the memory controller, wherein the memory access level is lower than a reference access level;
by the power manager, outputting a power decrease request signal to the memory controller;
by the power manager, after a preset period of a processing time passes, setting a supply power level of the memory to be a supply power level that is lower than a current supply power level.

9. The method of claim 8, wherein the setting a supply power level of the memory is characterized by outputting a power adjustment signal including information to adjust the supply power level of the memory to the memory controller, and
wherein the method further comprises:
by the memory controller, outputting a clock inactivation signal corresponding to the power adjustment signal; and
by the memory controller, receiving a clock, latching data, inactivating the clock in responding to the clock inactivation signal, and interrupting reception of the data.

10. The method of claim 9, wherein the power adjustment signal is output to the memory controller before the supply power level of the memory is set to be the supply power level that is lower than the current supply power level.

11. The method of claim 9, wherein the clock is inactivated during a memory power transition interval in which the supply power level of the memory changes.

12. The method of claim 11, further comprising:
by the power manager, interrupting the output of the power adjustment signal after the memory power transition interval;
by the memory controller, interrupting the output of the clock inactivation signal corresponding to interrupting of the power adjustment signal;
by the memory controller, activating the clock again and receiving the data again, after the memory power transition interval.

13. A system on chip (SOC) comprising:
a memory controller configured to control a memory; and
a power manager configured to manage a supply power level of the memory,
wherein the memory controller is configured to output, to the power manager, a memory access level indicating a frequency of accesses to the memory,
wherein the memory access level is lower than a reference access level,
wherein the power manager is configured to output a power decrease request signal to the memory controller, and to set the supply power level of the memory to be a supply power level that is lower than a current supply power level after a preset period of a processing time passes after the power decrease request signal is output.

14. The SOC of claim 13, wherein the power manager comprises:

an adjustment determination circuit configured to receive the memory access level, and to output a determination result indicating a result of comparing the memory access level with the reference access level; and
a power adjustment circuit configured to receive the determination result and output a power adjustment signal including information to control the supply power level of the memory to the memory controller.

15. The SOC of claim 14, wherein the power adjustment circuit outputs the power adjustment signal to the memory controller before the supply power level of the memory is set to be the supply power level that is lower than the current supply power level.

16. The SOC of claim 14, wherein the memory controller comprises:
an access level managing circuit configured to detect an access of a master, and to output the memory access level to the adjustment determination circuit;
a transition circuit configured to output a clock inactivation signal corresponding to the power adjustment signal; and
a latch circuit configured to receive a clock, latch data, inactivate the clock in responding to the clock inactivation signal, and interrupt reception of the data.

17. The SOC of claim 16, wherein the latch circuit inactivates the clock during memory power transition interval in which the supply power level of the memory changes.

18. The SOC of claim 17, wherein the power adjustment circuit interrupts the output of the power adjustment signal after the memory power transition interval,
wherein the transition circuit interrupts the output of the clock inactivation signal corresponding to interrupting of the power adjustment signal, and
wherein the latch circuit activates the clock again and receives the data again, after the memory power transition interval.

19. A semiconductor system comprising:
a radio frequency (RF) transceiver configured to generate a reception signal by processing an RF signal received via an antenna or to process a transmission signal and transmit a processed transmission signal via the antenna; and
an application processor configured to extract reception data by demodulating the reception signal or to generate the transmission signal by modulating reception data,
wherein the application processor comprises:
a memory;
a processor configured to execute instructions to control the memory; and
a power manager configured to manage a power level of supply power with respect to the memory,
wherein the power manager is further configured to manage a supply power level that is applied to the memory through a handshake with the memory.

20. The semiconductor system of claim 19, wherein the processor is further configured to output, to the power manager, a memory access level indicating a frequency of accesses to the memory, and the power manager is further configured to adjust the supply power level according to the memory access level.

* * * * *